(12) United States Patent
Lee et al.

(10) Patent No.: US 11,933,817 B2
(45) Date of Patent: Mar. 19, 2024

(54) PROBE CARD DEVICE AND TRANSMISSION STRUCTURE

(71) Applicant: CHUNGHWA PRECISION TEST TECH. CO., LTD., Taoyuan (TW)

(72) Inventors: Wen-Tsung Lee, New Taipei (TW); Hsun-Tai Wei, Taoyuan (TW); Pang-Chi Huang, Taoyuan (TW); Meng-Chieh Cheng, Taipei (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 206 days.

(21) Appl. No.: 17/574,694

(22) Filed: Jan. 13, 2022

(65) Prior Publication Data
US 2023/0033013 A1 Feb. 2, 2023

(30) Foreign Application Priority Data
Jul. 29, 2021 (TW) ................................. 110127820

(51) Int. Cl.
*G01R 1/073* (2006.01)
(52) U.S. Cl.
CPC ..... *G01R 1/07342* (2013.01); *G01R 1/07357* (2013.01)
(58) Field of Classification Search
CPC ............ G01R 1/07342; G01R 1/07357; G01R 1/06733
See application file for complete search history.

(56) References Cited

U.S. PATENT DOCUMENTS

2011/0006796 A1* 1/2011 Kister ................. G01R 1/0408
324/756.01

FOREIGN PATENT DOCUMENTS

WO WO-9949325 A1 * 9/1999 ......... G01R 1/07342

* cited by examiner

*Primary Examiner* — Lee E Rodak
(74) *Attorney, Agent, or Firm* — Li & Cai Intellectual Property (USA) Office

(57) ABSTRACT

A probe card device and a transmission structure are provided. The transmission structure includes a supporting layer, a plurality of metal conductors spaced apart from each other and slantingly inserted into the supporting layer, and an insulating resilient layer formed on the supporting layer. Each of the metal conductors includes a positioning segment held in the supporting layer, a connecting segment and an embedded segment respectively extending from two ends of the positioning segment, and an exposed segment extending from the embedded segment. Each of the embedded segments is embedded and fixed in the insulating resilient layer, and each of the exposed segments protrudes from the insulating resilient layer. When any one of the exposed segments is pressed by an external force, the insulating resilient layer is configured to absorb the external force through the corresponding embedded segment so as to have a deformation providing a stroke distance.

5 Claims, 13 Drawing Sheets

PROBE CARD DEVICE AND TRANSMISSION STRUCTURE

CROSS-REFERENCE TO RELATED PATENT APPLICATION

This application claims the benefit of priority to Taiwan Patent Application No. 110127820, filed on Jul. 29, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a probe card device and a transmission structure.

BACKGROUND OF THE DISCLOSURE

A conventional vertical probe card includes a probe retainer and a plurality of conductive probes that are held by the probe retainer. When the conventional vertical probe card is used to receive an external force and then generates a stroke, the external force and the stroke can be absorbed by deformation of the conductive probes. However, the structural design of the conventional vertical probe card has been limited to the above configuration so as to be difficult to be further improved.

SUMMARY OF THE DISCLOSURE

In response to the above-referenced technical inadequacy, the present disclosure provides a probe card device and a transmission structure to effectively improve on the issues associated with conventional vertical probe cards.

In one aspect, the present disclosure provides a transmission structure, which includes a supporting layer, a plurality of metal conductors, and an insulating resilient layer. The supporting layer has an inner surface and an outer surface that is opposite to the inner surface. Each of the metal conductors is integrally formed as an elongated structure. The metal conductors are spaced apart from each other and are slantingly inserted into the supporting layer along a predetermined direction. Each of the metal conductors includes a positioning segment held in the supporting layer, a connecting segment extending from one end of the positioning segment and configured to be connected to a space transformer, an embedded segment extending from another end of the positioning segment, and an exposed segment that extends from the embedded segment in a direction away from the positioning segment and that is configured to separably abut against a device under test (DUT), in which a length of the embedded segment is greater than a length of the exposed segment. The insulating resilient layer is formed on the inner surface of the supporting layer so as to embed and fix the embedded segment of each of the metal conductors therein. The exposed segment of each of the metal conductors protrudes from the insulating resilient layer. When the exposed segment of any one of the metal conductors is pressed by an external force along a testing direction that is not parallel to the predetermined direction, the insulating resilient layer is configured to absorb the external force through the embedded segment of the any one of the metal conductors so as to have a deformation that provides a stroke distance.

In another aspect, the present disclosure provides a probe card device, which includes a transmission structure and a probe head. The transmission structure includes a supporting layer, a plurality of metal conductors, and an insulating resilient layer. The supporting layer has an inner surface and an outer surface that is opposite to the inner surface. Each of the metal conductors is integrally formed as an elongated structure. The metal conductors are spaced apart from each other and are slantingly inserted into the supporting layer along a predetermined direction. Each of the metal conductors includes a positioning segment held in the supporting layer, a connecting segment extending from one end of the positioning segment and configured to be connected to a space transformer, an embedded segment extending from another end of the positioning segment, and an exposed segment that extends from the embedded segment in a direction away from the positioning segment, in which a length of the embedded segment is greater than a length of the exposed segment. The insulating resilient layer is formed on the inner surface of the supporting layer so as to embed and fix the embedded segment of each of the metal conductors therein. The exposed segment of each of the metal conductors is disposed on a surface of the insulating resilient layer. The probe head includes a probe retainer and a plurality of conductive probes that are held by the probe retainer. Moreover, an end of the conductive probes abuts against the exposed segments of the metal conductors, respectively, and another end of the conductive probes is configured to separably abut against a device under test (DUT). When any one of the conductive probes is pressed by an external force along a testing direction that is not parallel to the predetermined direction, the insulating resilient layer is configured to absorb the external force through the corresponding metal conductor so as to have a deformation that provides a stroke distance.

Therefore, in any one of the transmission structure and the probe card device provided by the present disclosure, each of the metal conductors arranged in the insulating resilient layer is not parallel to the testing direction, so that the insulating resilient layer can be used to replace part of a function of a conductive probe of the conventional vertical probe card, and a length of each of the metal conductors can be effectively reduced by the cooperation of the embedded segment and the insulating resilient layer.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

First Embodiment

Figure 1:
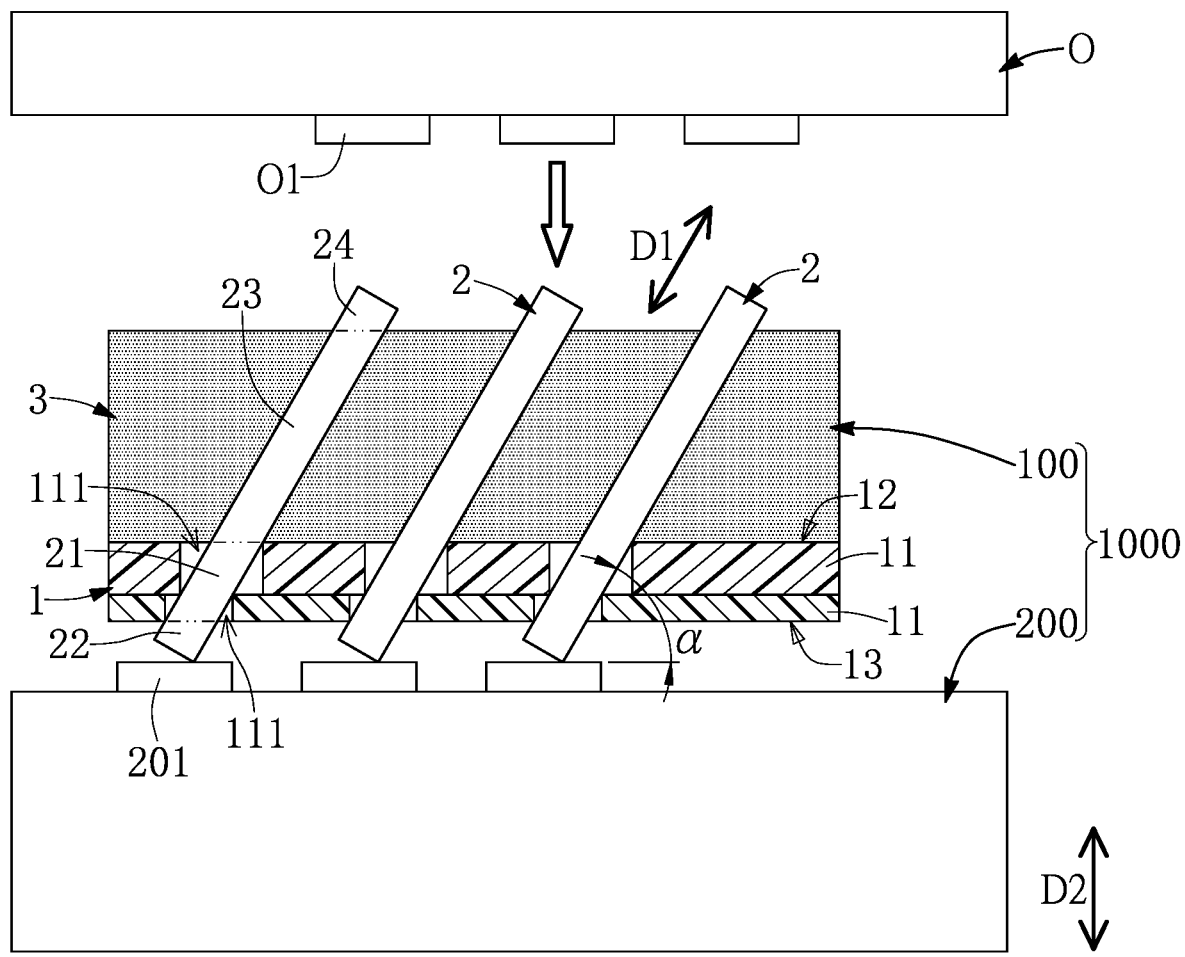
FIG. 1 is a planar view showing a probe card device in a first configuration according to a first embodiment of the present disclosure.
Figure 2:
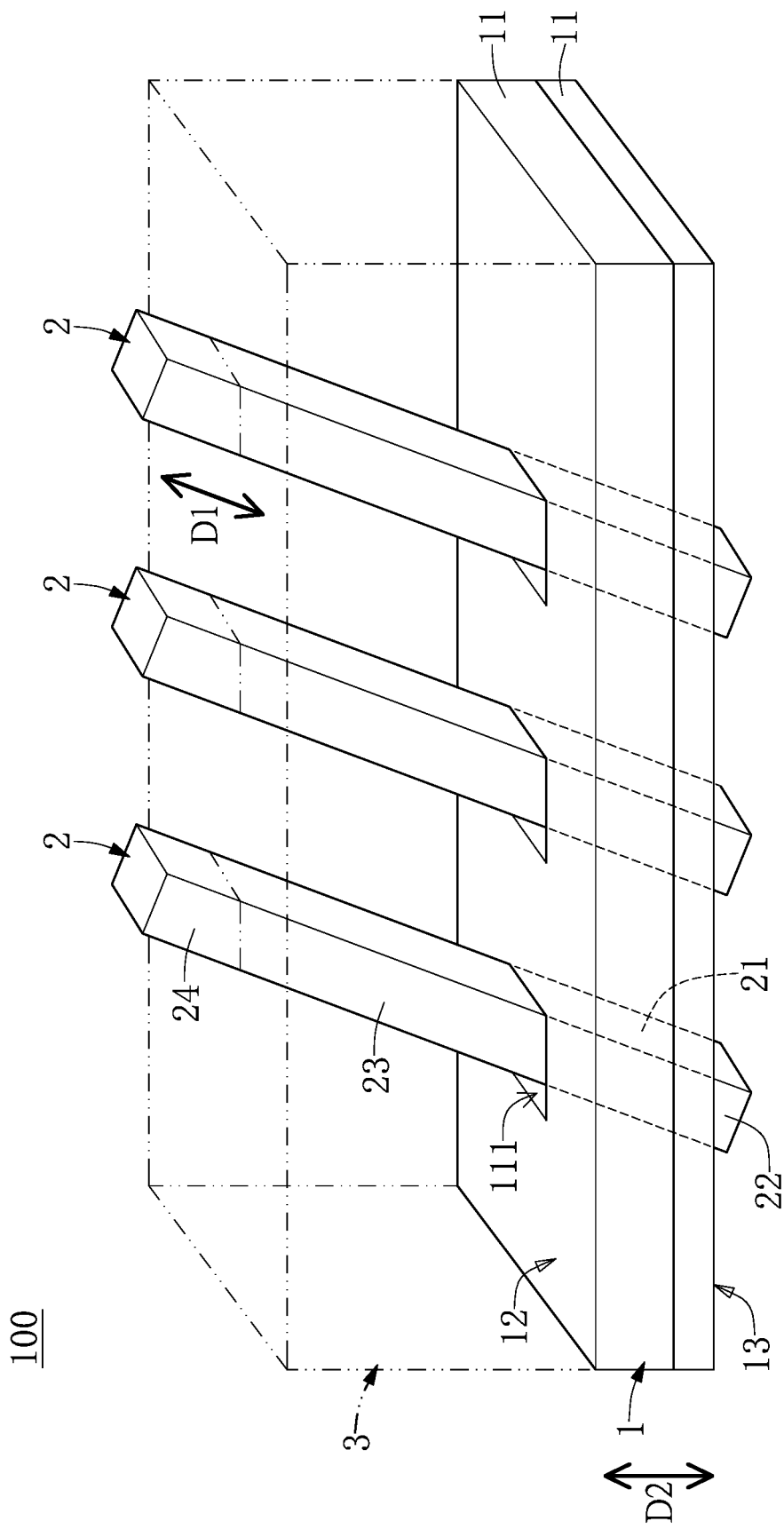
FIG. 2 is a perspective view of a transmission structure according to the first embodiment of the present disclosure.

Referring to FIG. 1 to FIG. 4, a first embodiment of the present disclosure provides a transmission structure 100. As shown in FIG. 1 and FIG. 2, one side portion of the transmission structure 100 is assembled to a space transformer 200, and another side portion of the transmission structure 100 is configured to separably abut against a device under test (DUT) O. In other words, the transmission structure 100 in the present embodiment is used as a probe card, but the present disclosure is not limited thereto.

The transmission structure 100 includes a supporting layer 1, a plurality of metal conductors 2 that are inserted into the supporting layer 1, and an insulating resilient layer 3 that is formed on the supporting layer 1 and that covers a portion of each of the metal conductors 2. The supporting layer 1 is provided to maintain the position of the metal conductors 2 and is used as a carrier for the forming of the insulating resilient layer 3, so that the metal conductors 3 are fixed to and not detached from the insulating resilient layer 3.

The supporting layer 1 has an inner surface 12 and an outer surface 13 that is opposite to the inner surface 12. The supporting layer 1 in the present embodiment includes two guiding boards 11 stacked upon each other, and surfaces of the two guiding boards 11 arranged away from each other are respectively defined as the inner surface 12 and the outer surface 13. Each of the two guiding boards 11 has a plurality of thru-holes 111, and the thru-holes 111 of any one of the two guiding boards 11 are in spatial communication with the thru-holes 111 of the other one of the two guiding boards 11, respectively, but the present disclosure is not limited thereto. For example, in other embodiments of the present disclosure not shown in the drawings, the supporting layer 1 can be one guiding board.

Each of the metal conductors 2 is integrally formed as an elongated structure, and the metal conductors 2 are spaced apart from each other and are slantingly inserted into the supporting layer 1 along a predetermined direction D1. As the metal conductors 2 in the present embodiment are of the substantially same structure, the following description discloses the structure of just one of the metal conductors 2 for the sake of brevity, but the present disclosure is not limited thereto. For example, in other embodiments of the present disclosure not shown in the drawings, any two of the metal conductors 2 can be of different structures.

Specifically, the metal conductor 2 in the present embodiment includes a positioning segment 21, a connecting segment 22 that extends from one end of the positioning segment 21, an embedded segment 23 that extends from another end of the positioning segment 21, and an exposed segment that extends from the embedded segment 23 in a direction away from the positioning segment 21. In other words, the metal conductor 2 sequentially has the connecting segment 22, the positioning segment 21, the embedded segment 23, and the exposed segment 24.

The positioning segment 21 of each of the metal conductors 2 is held in the supporting layer 1, and the two guiding boards 11 of the supporting layer 1 of the transmission structure 100 in the present embodiment are in a staggered arrangement so as to enable the positioning segment 21 of each of the metal conductors 2 to be held and arranged in the predetermined direction D1. In other words, the metal conductors 2 can be substantially parallel to each other by the positioning segments 21 being in cooperation with the supporting layer 1. The positioning segment 21 of each of the metal conductors 2 in the present embodiment is inserted into two of the thru-holes 111 that respectively belong to the two guiding boards 11 and that are in spatial communication with each other.

Figure 3:
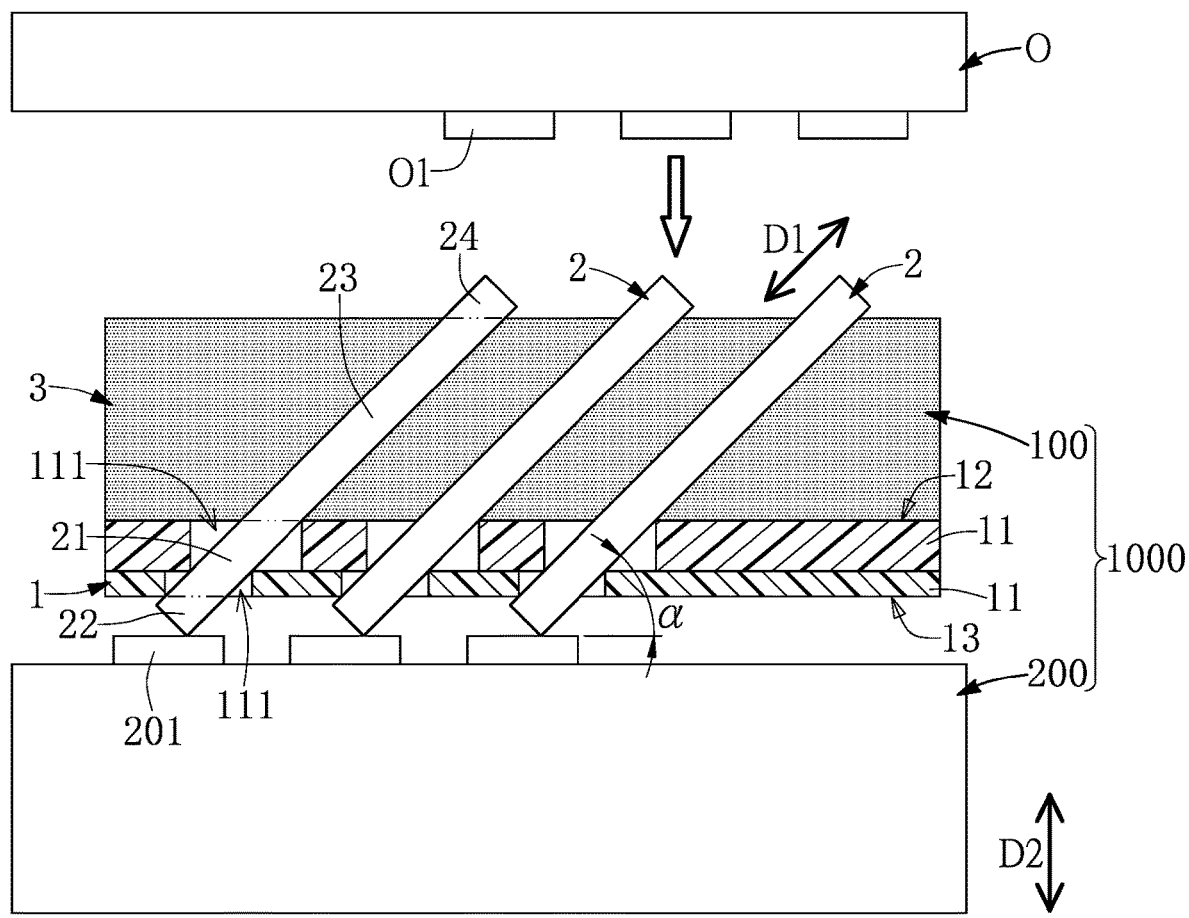
FIG. 3 is a planar view showing the probe card device in a second configuration according to the first embodiment of the present disclosure.

Moreover, the positioning segment 21 of any one of the metal conductors 2 and the outer surface 13 of the supporting layer 1 have a slanting angle α therebetween that is within a range from 56 degrees to 88 degrees. In other words, the slanting angle α is defined between the predetermined direction D1 and the outer surface 13 of the supporting layer 1. Accordingly, each of the metal conductors 2 can be provided with the slanting angle α of different values (as shown in FIG. 1 and FIG. 3) so as to facilitate the transmission structure 100 to satisfy different design requirements.

The connecting segments 22 of the metal conductors 2, which protrude from the outer surface 13 of the supporting layer 1 and are arranged at one side of the transmission structure 100, are configured to be connected to connection pads 201 of the space transformer 200, respectively. The exposed segments 24 of the metal conductors 2, which are arranged at another side of the transmission structure 100, are configured to separably abut against metal pads O1 of the DUT (e.g., a semiconductor wafer) O, respectively. Moreover, in each of the metal conductors 2, a length of the embedded segment 23 is greater than a length of the exposed segment 24 and is also greater than a length of the connecting segment 22.

The insulating resilient layer 3 is formed on the inner surface 12 of the supporting layer 1 (e.g., the insulating resilient layer 3 is integrally formed as a single one-piece structure) so as to embed and fix the embedded segment 23 of each of the metal conductors 2 therein (e.g., the embedded segment 23 is gaplessly connected to the insulating resilient layer 3). Moreover, the exposed segment 24 of each of the metal conductors 2 protrudes from the insulating resilient layer 3. In other words, a surface of the insulating resilient layer 3 adjacent to the exposed segments 24 faces toward the DUT O.

It should be noted that the insulating resilient layer 3 shown in the drawings of the present embodiment is not filled into any one of the thru-holes 111 of the supporting layer 1, but the present disclosure is not limited thereto. For example, in other embodiments of the present disclosure not shown in the drawings, the insulating resilient layer 3 can extend into the thru-holes 111 that are formed in the guiding board 11 having the inner surface 12, so that the positioning segment 21 of each of the metal conductors 2 can be covered and fixed by the insulating resilient layer 3.

Specifically, when the exposed segment 24 of any one of the metal conductors 2 is pressed by an external force along a testing direction D2 that is not parallel to the predetermined direction D1 (e.g., when the exposed segment 24 abuts against the DUT O), the insulating resilient layer 3 is configured to absorb the external force through the embedded segment 23 of the any one of the metal conductors 2 so as to have a deformation that provides a stroke distance.

Accordingly, in the transmission structure 100 provided by the present embodiment, each of the metal conductors 2 arranged in the insulating resilient layer 3 is not parallel to the testing direction D2, so that the insulating resilient layer 3 can be used to replace part of a function of conductive probe of the conventional vertical probe card, and a length of each of the metal conductors 2 can be effectively reduced by the cooperation of the embedded segment 23 and the insulating resilient layer 3.

Moreover, the transmission structure 100 in the present embodiment is provided by using the insulating resilient layer 3 to face toward the DUT O, so that when the transmission structure 100 is used to test the DUT O and the insulating resilient layer 3 unintentionally contacts the DUT O, the DUT O is not easily damaged.

Specifically, in order to effectively absorb the external force and provide the stroke distance by the insulating resilient layer 3, the slanting angle α is preferably within the above range from 56 degrees to 88 degrees, but the present disclosure is not limited thereto. Moreover, the insulating resilient layer 3 is limited to a silicone resilient layer, a total thickness of the supporting layer 1 and the insulating resilient layer 3 is less than or equal to 2 mm, and a thickness of the insulating resilient layer 3 is preferably at least two times of a thickness of the supporting layer 1.

Figure 4:
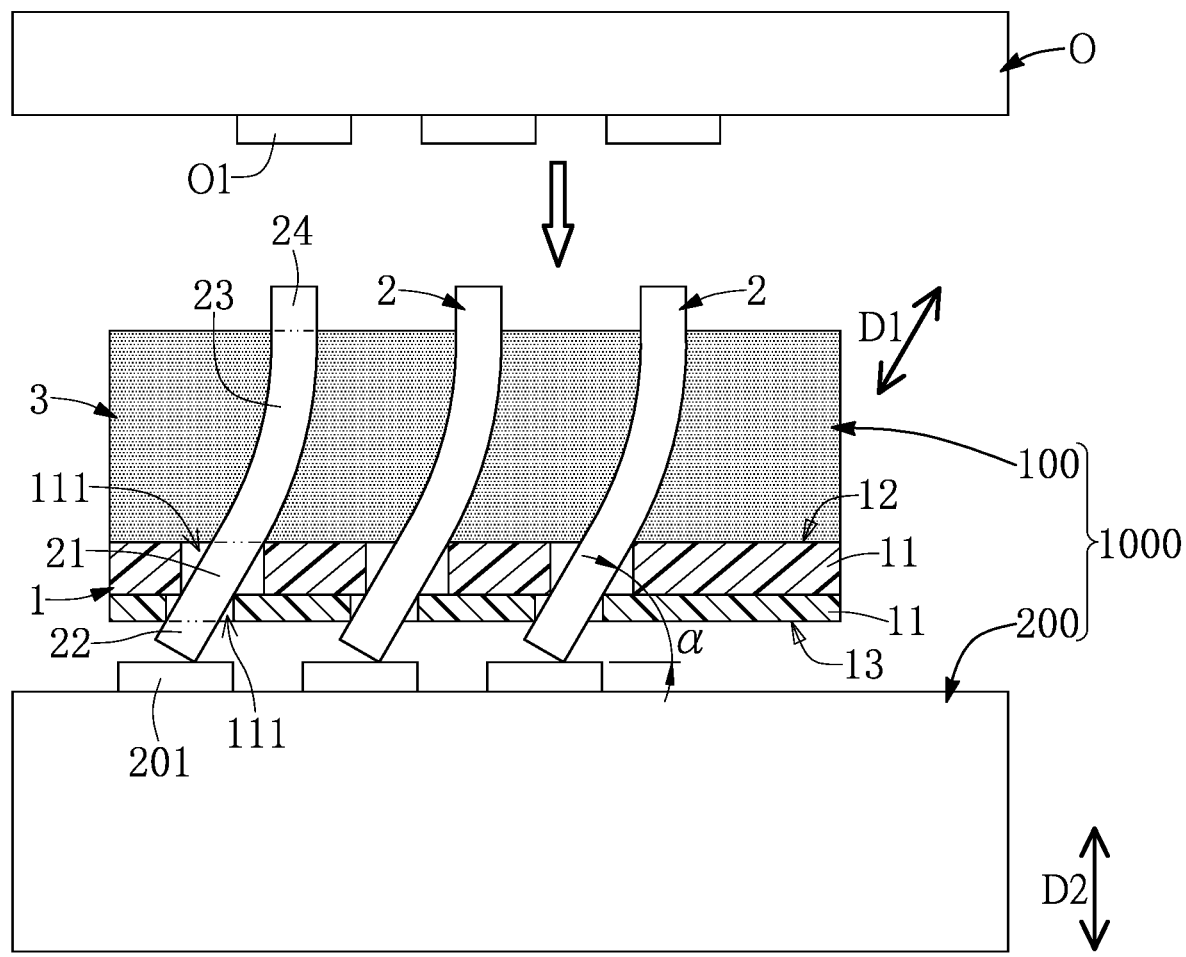
FIG. 4 is a planar view showing the probe card device in a third configuration according to the first embodiment of the present disclosure.

In addition, each of the metal conductors 2 in the present embodiment is a straight structure, but the present disclosure is not limited thereto. For example, as shown in FIG. 4, the embedded segment 23 and the exposed segment 24 of each of the metal conductors 2 can be formed in a curved shape, thereby enabling the embedded segments 23 of the metal conductors 2 to receive force in a same direction, and allowing the exposed segment 24 of each of the metal conductors 2 to protrude from the insulating resilient layer 4 along the testing direction D2. Moreover, in other embodiments of the present disclosure not shown in the drawings, a part of the metal conductor 2 can be in an irregular shape, or a cross section of the metal conductor 2 can be a polygon shape (e.g., a rectangular shape) or a circular shape.

Second Embodiment

Referring to FIG. 5 to FIG. 8, a second embodiment of the present disclosure is provided, which is similar to the first embodiment of the present disclosure. For the sake of brevity, descriptions of the same components in the first and second embodiments of the present disclosure will be omitted herein, and the following description only discloses different features between the first and second embodiments.

In the present embodiment, at least part of the embedded segment 23 of each of the metal conductors 2 has a pre-bending portion 231. When the exposed segment 24 of any one of the metal conductors 2 is pressed by the external force, the embedded segment 23 tends to be deformed at the pre-bending portion 231 so as to transmit the external force to the insulating resilient layer 3. Positions of the pre-bending portions 231 of the metal conductors 2 relative to the supporting layer 1 are substantially the same, thereby enabling the embedded segments 23 to receive force in a same direction.

Figure 5:
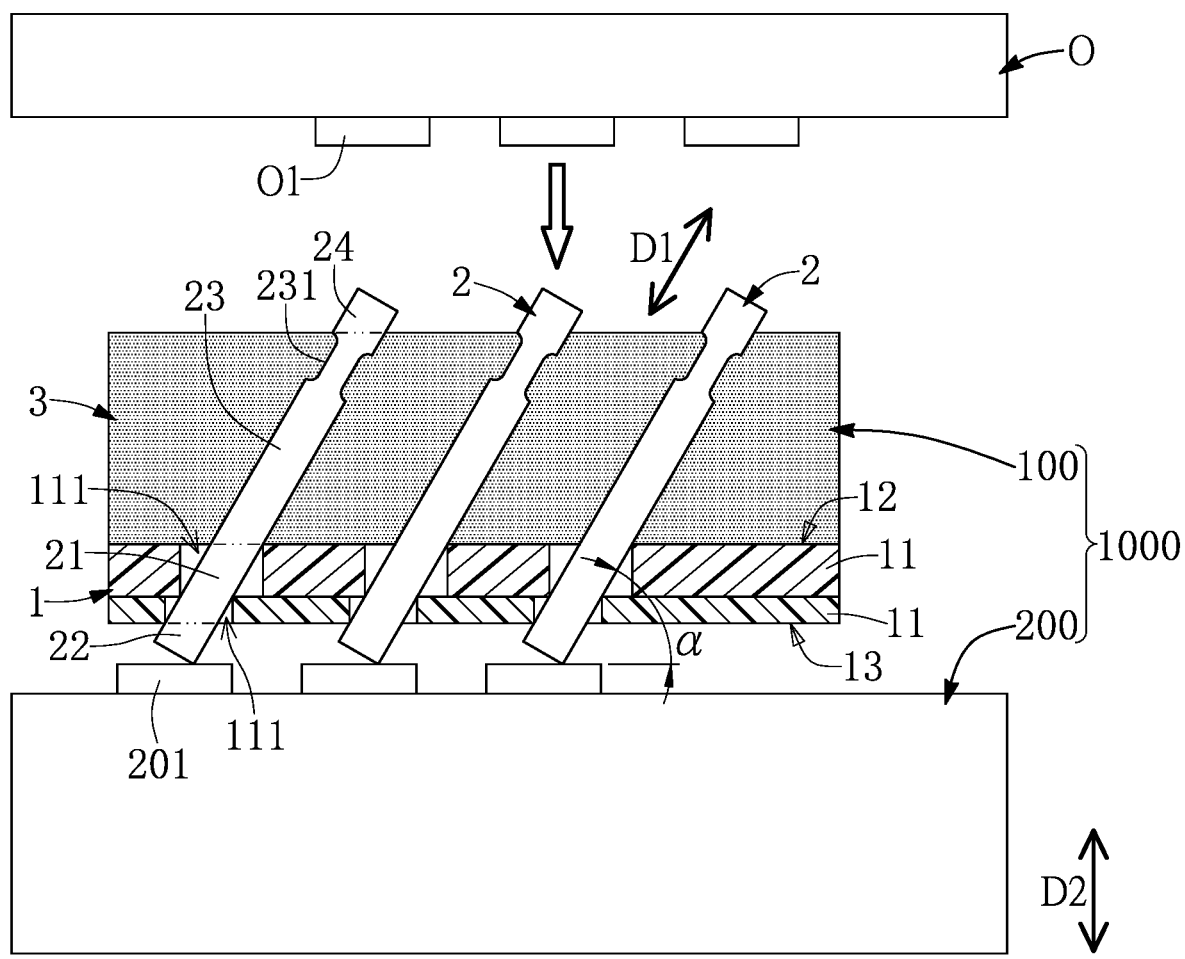
FIG. 5 is a planar view showing the probe card device in a first configuration according to a second embodiment of the present disclosure.
Figure 6:
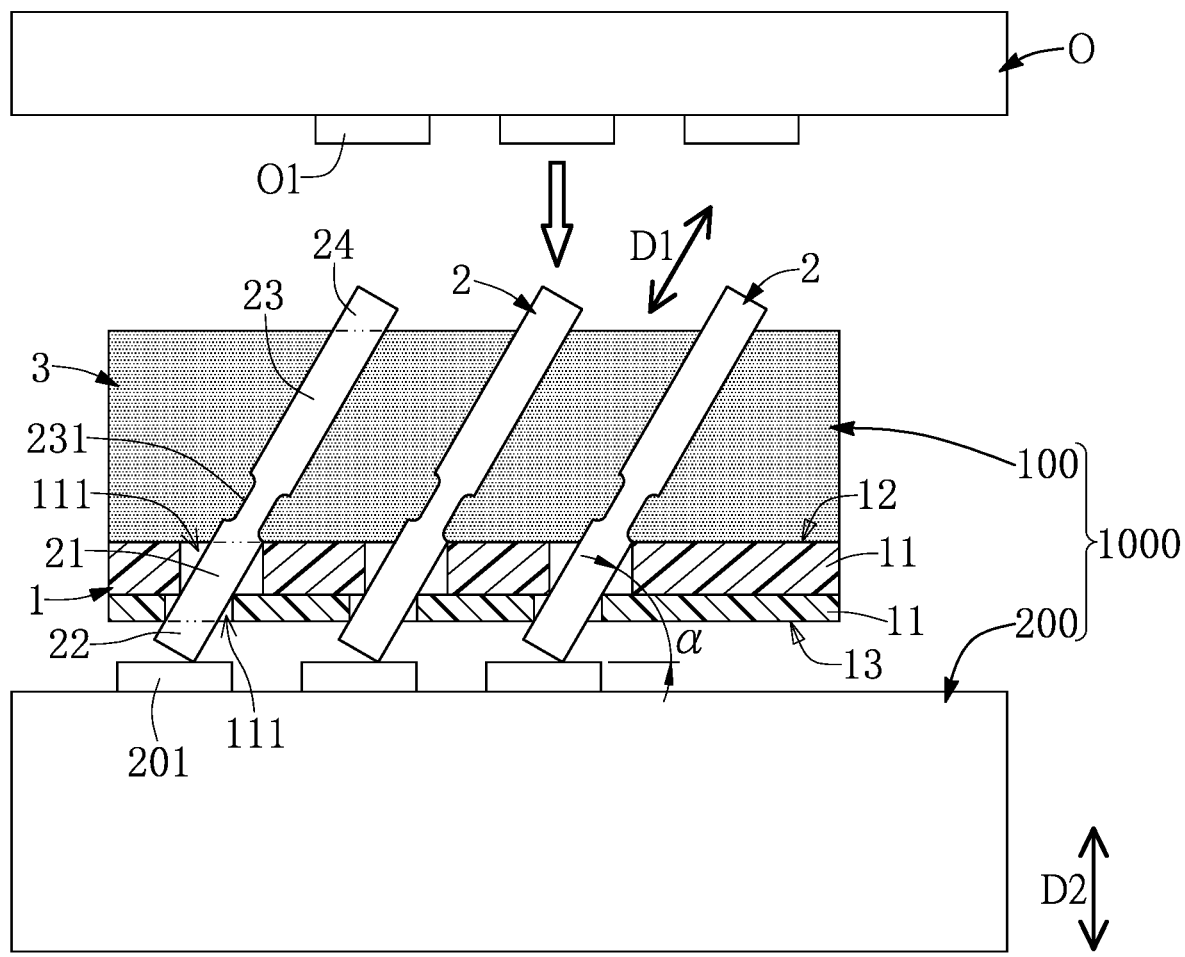
FIG. 6 is a planar view showing the probe card device in a second configuration according to the second embodiment of the present disclosure.
Figure 7:
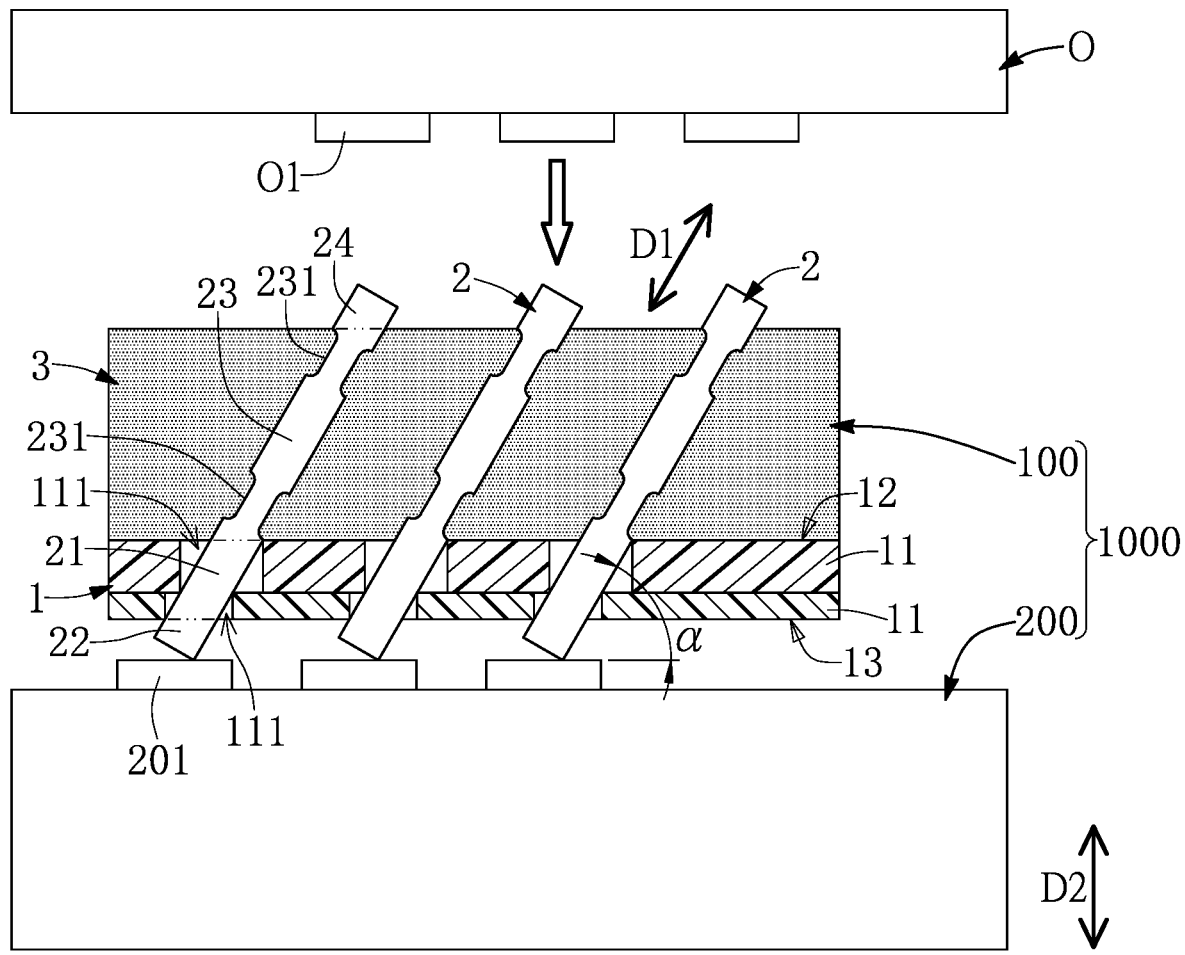
FIG. 7 is a planar view showing the probe card device in a third configuration according to the second embodiment of the present disclosure.
Figure 8:
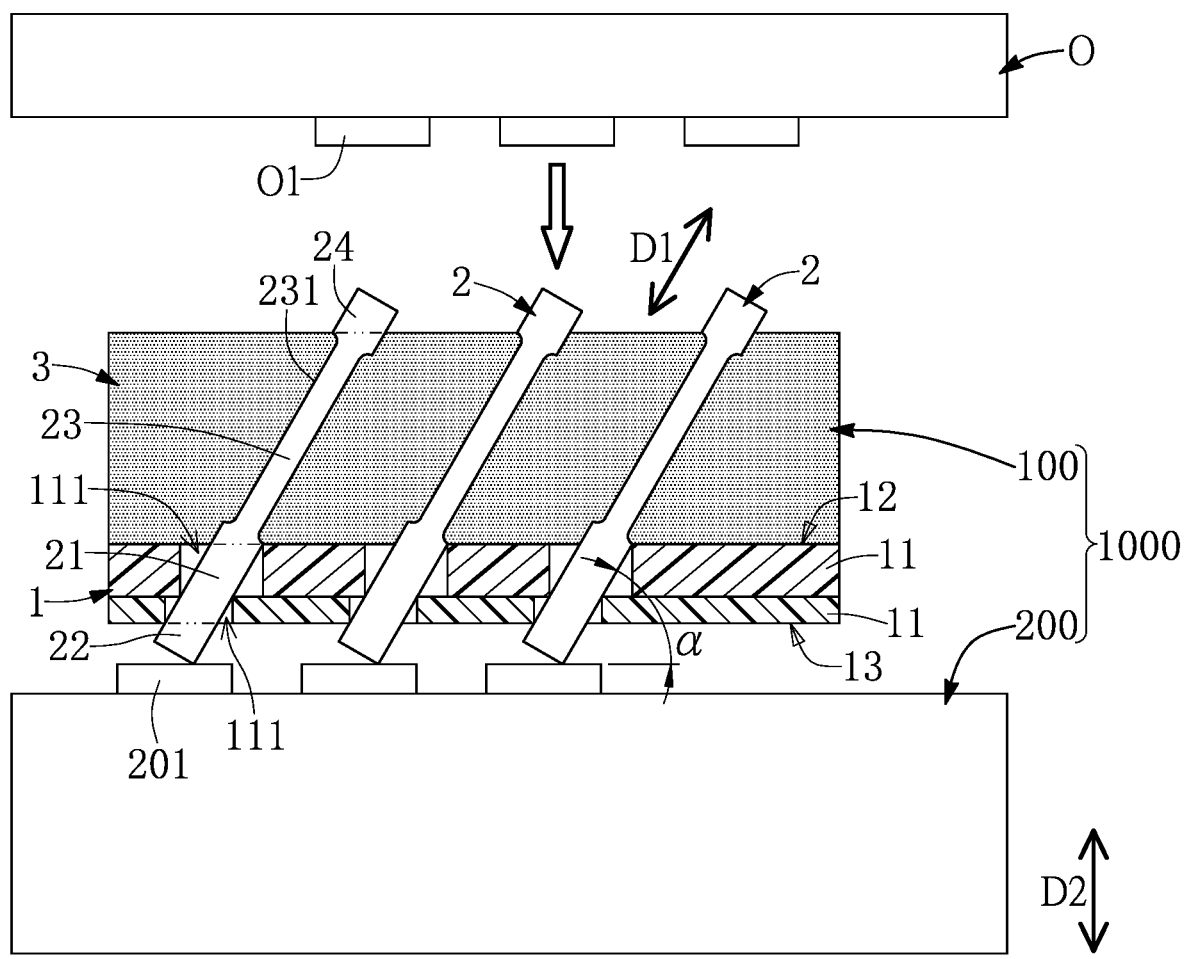
FIG. 8 is a planar view showing the probe card device in a fourth configuration according to the second embodiment of the present disclosure.

In each of the metal conductors 2, structure of the pre-bending portion 231 of the embedded segment 23 can be changed or adjusted according to design requirements. For example, as shown in FIG. 5 and FIG. 6, a percentage of an area of the embedded segment 23 occupied by the pre-bending portion 231 can be less than or equal to 50%, and the pre-bending portion 231 can be arranged adjacent to the exposed segment 24 (shown in FIG. 5) or the positioning segment (shown in FIG. 6); or, as shown in FIG. 7, a quantity of the pre-bending portion 231 formed on the embedded segment 23 can be more than one; or, as shown in FIG. 8, the percentage of the area of the embedded segment 23 occupied by the pre-bending portion 231 can be greater than or equal to 80%.

Third Embodiment

Referring to FIG. 9 to FIG. 12, a third embodiment of the present disclosure is provided, which is similar to the first and second embodiments of the present disclosure. For the sake of brevity, descriptions of the same components in the first to third embodiments of the present disclosure will be omitted herein, and the following description only discloses different features among the present embodiment and the first and second embodiments.

In the present embodiment, the supporting layer 1 includes a connection circuit 14 arranged on the inner surface 12, and at least two of the metal conductors 2 are each defined as a target conductor 2a. Each of the at least two target conductors 2a has a protruding portion 25 extending from the embedded segment 23 thereof and embedded in the insulating resilient layer 3. The protruding portion 25 of each of the at least two target conductors 2a is arranged adjacent to the positioning segment 21, and the protruding portions 25 of the at least two target conductors 2a abut against the connection circuit 14 so as to be electrically coupled to each other.

Figure 9:
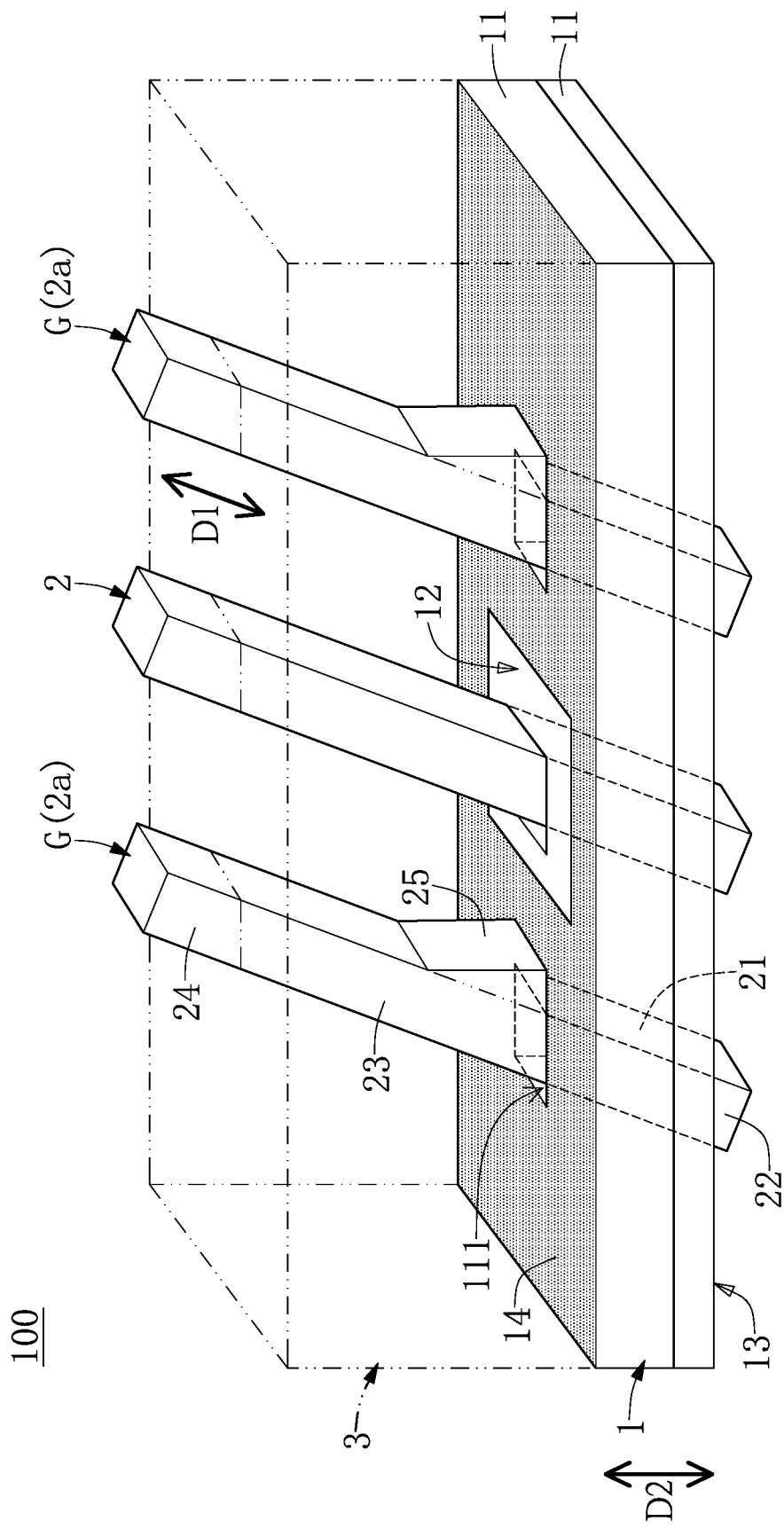
FIG. 9 is a planar view showing the probe card device in a first configuration according to a third embodiment of the present disclosure.
Figure 10:
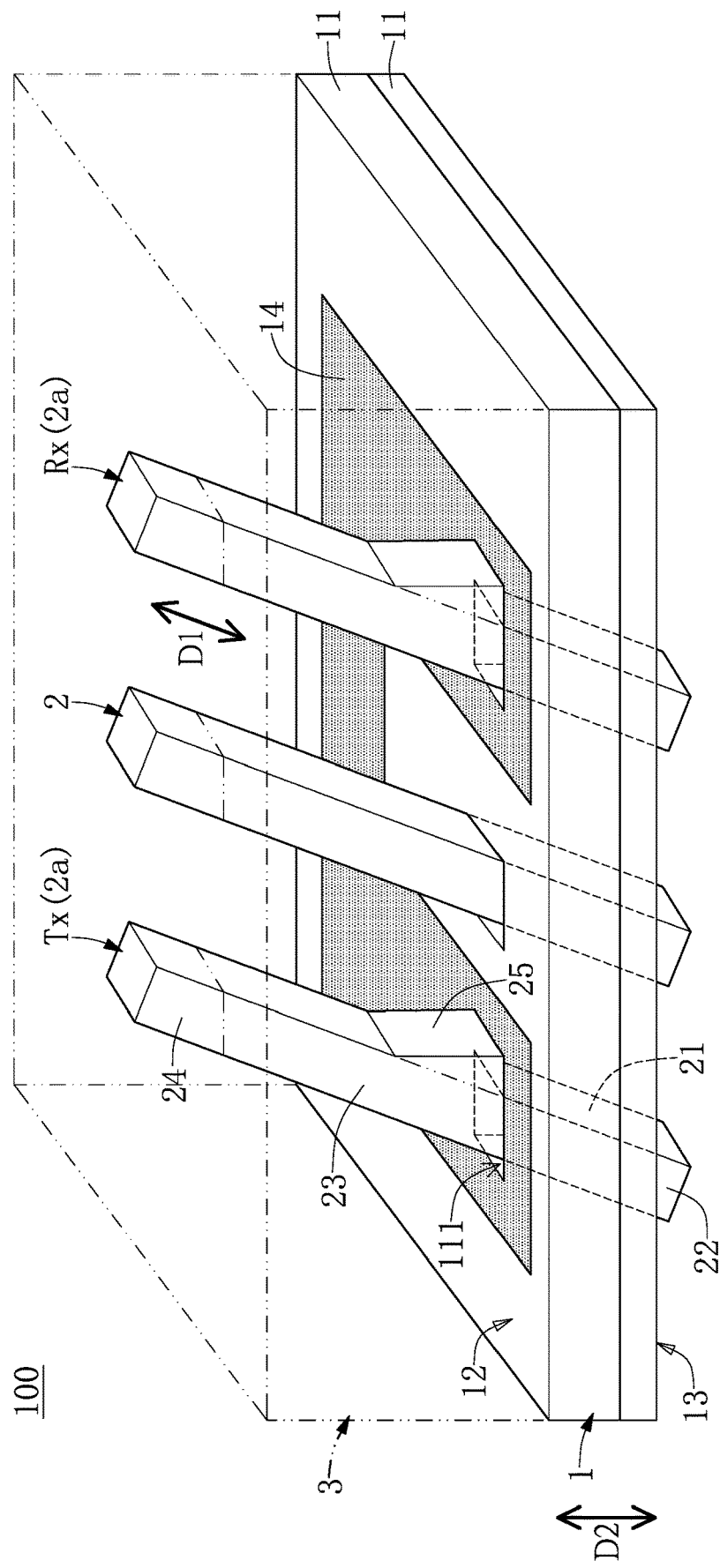
FIG. 10 is a planar view showing the probe card device in a second configuration according to the third embodiment of the present disclosure.

Specifically, the connection circuit 14 and each of the at least two target conductors 2a can be changed or adjusted according to design requirements. For example, as shown in FIG. 9, the at least two target conductors 2a are at least two grounding conductors G, respectively, thereby establishing a common ground effect through the connection circuit 14; or, as shown in FIG. 10, the at least two target conductors 2a are at least one pair of differential signal conductors Tx, Rx, thereby establishing a loop circuit through the connection circuit 14.

Figure 11:
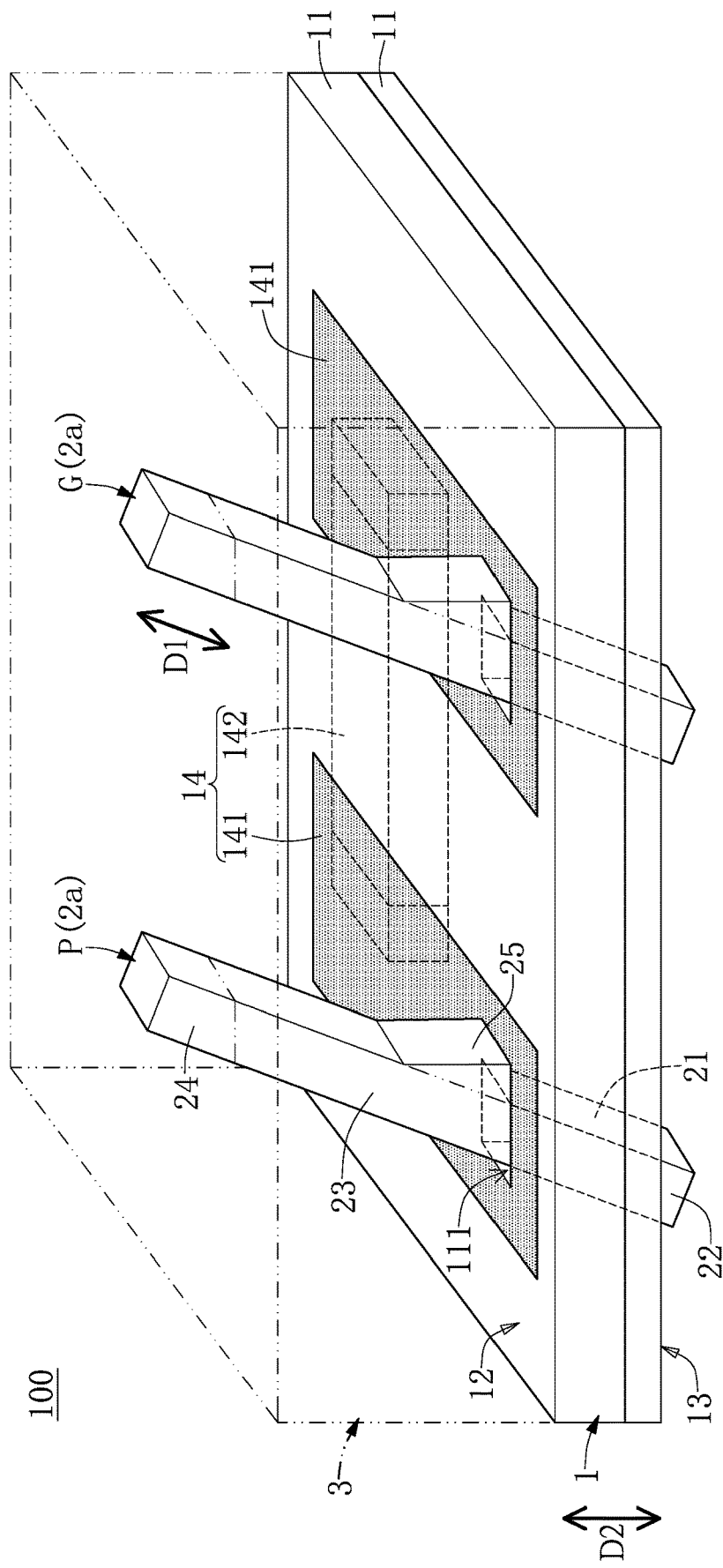
FIG. 11 is a planar view showing the probe card device in a third configuration according to the third embodiment of the present disclosure.
Figure 12:
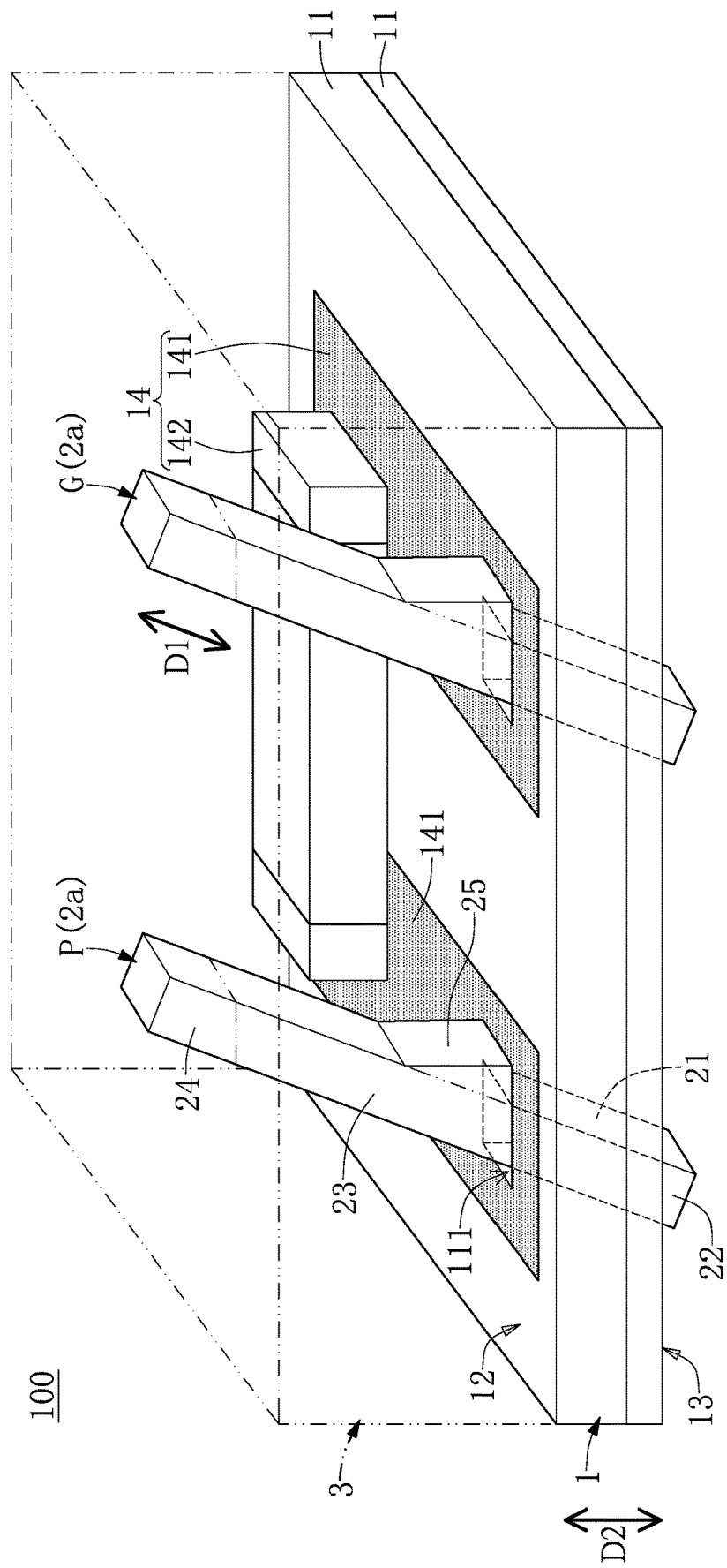
FIG. 12 is a planar view showing the probe card device in a fourth configuration according to the third embodiment of the present disclosure.

In addition, as shown in FIG. 11 and FIG. 12, the connection circuit 14 can include two transmission lines 141 that are formed on the inner surface 12 and a capacitor 142 that connects the two transmission lines 141. The at least two target conductors 2a include a power conductor P and a grounding conductor G. The protruding portion 25 of the power conductor P and the protruding portion 25 of the grounding conductor G abut against the two transmission lines 141, respectively, thereby being electrically coupled to the capacitor 142 for reducing an inductance change. Moreover, according to design requirements, the capacitor 142 can be selectively embedded in the supporting layer 1 (shown in FIG. 11) or the insulating resilient layer 3 (shown in FIG. 12).

It should be noted that the protruding portion 25 of each of the at least two target conductors 2a in the present embodiment is formed on a surface of the embedded segment 23 that faces toward the supporting layer 1, thereby facilitating to abut against the connection circuit 14, but the present disclosure is not limited thereto. For example, in other embodiments of the present disclosure not shown in the drawings, the protruding portion 25 can be formed on any surface of the embedded segment 23 that does not face toward the supporting layer 1

Fourth Embodiment

Figure 13:
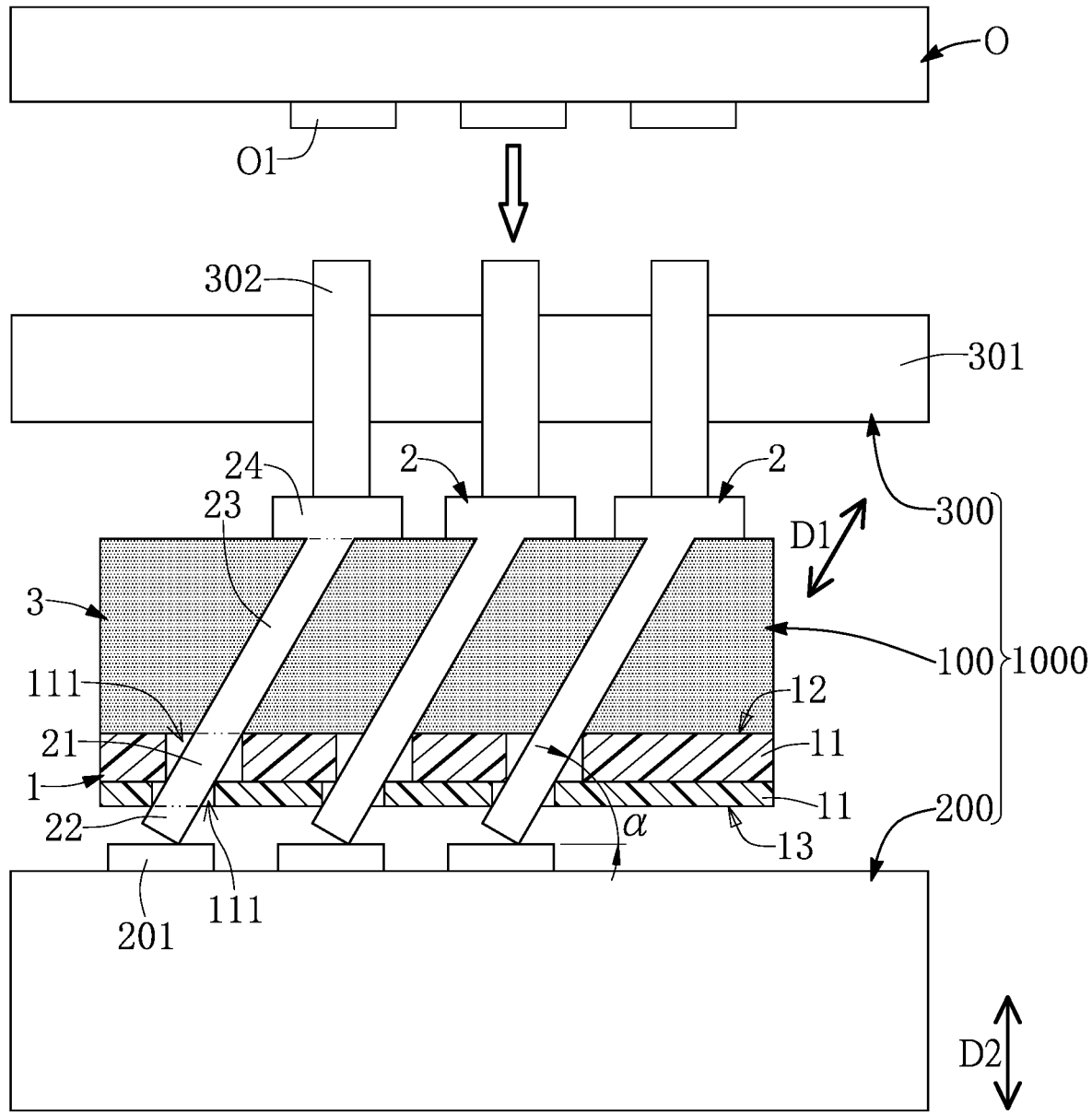
FIG. 13 is a planar view showing the probe card device according to a fourth embodiment of the present disclosure.

Referring to FIG. 13, a fourth embodiment of the present disclosure is provided, which is similar to the first to third embodiments of the present disclosure. For the sake of brevity, descriptions of the same components in the first to fourth embodiments of the present disclosure will be omitted herein, and the following description only discloses different features among the present embodiment and the first to third embodiments.

The present embodiment provides a probe card device 1000, which includes a transmission structure 100, a space transformer 200 that is assembled to one side portion of the transmission structure 100, and a probe head 300 that separably abuts against another side portion of the transmission structure 100. The transmission structure 100 in the present embodiment is substantially identical to that of the first to third embodiment, but the exposed segment 24 of each of the metal conductors 2 in the present embodiment is a metal pad that is (flatly) disposed on a surface of the insulating resilient layer 3 away from the supporting layer 1. In other words, the exposed segment 24 and the embedded segment 23 of each of the metal conductors 2 in the present embodiment have an acute angle there-between.

It should be noted that the transmission structure 100 in the present embodiment is described in cooperation with the space transformer 200 and the probe head 300, but the present disclosure is not limited thereto. For example, in other embodiments of the present disclosure not shown in the drawings, the transmission structure 100 can be independently used (e.g., sold) or can be released with just the probe head 300.

Moreover, the probe head 300 includes a probe retainer 301 and a plurality of conductive probes 302 that are held by the probe retainer 301. Moreover, an end of the conductive probes 302 abuts against the exposed segments 24 of the metal conductors 2, respectively, and another end of the conductive probes 302 is configured to separably abut against the DUT O (e.g., the metal pads O1). When any one of the conductive probes 302 is pressed by an external force along a testing direction D2 that is not parallel to the predetermined direction D1, the insulating resilient layer 3 is configured to absorb the external force through the corresponding metal conductor 2 so as to have a deformation that provides a stroke distance.

Accordingly, in the probe card device 1000 provided by the present embodiment, each of the metal conductors 2 arranged in the insulating resilient layer 3 is not parallel to the testing direction D2, so that the insulating resilient layer 3 can be used to replace part of a function of conductive probe of the conventional vertical probe card, and a length of each of the metal conductors 2 can be effectively reduced by the cooperation of the embedded segment 23 and the insulating resilient layer 3.

Specifically, the conductive probe 302 in the present embodiment is provided to transmit a signal and the external force, and does not need to absorb the external force or to provide the stroke distance by having a deformation, so that the conductive probe 302 can be controlled to have a shorter length, and the conductive probe 302 used to abut against the DUT O can be replaced for effectively reducing the cost of the probe card device 1000.

Beneficial Effects of the Embodiments

In conclusion, in any one of the transmission structure and the probe card device provided by the present disclosure, each of the metal conductors arranged in the insulating resilient layer is not parallel to the testing direction, so that the insulating resilient layer can be used to replace part of a function of the conductive probe of the conventional vertical probe card, and a length of each of the metal conductors can be effectively reduced by the cooperation of the embedded segment and the insulating resilient layer.

Moreover, the transmission structure in the present disclosure is provided by using the insulating resilient layer to face toward the DUT, so that when the transmission structure is used to test the DUT and the insulating resilient layer unintentionally contacts the DUT, the DUT is not easily damaged.

Furthermore, in the probe card device provided by the present disclosure, the conductive probe is provided to transmit a signal and the external force, and does not need to absorb the external force or to provide the stroke distance by having a deformation, so that the conductive probe can be controlled to have a shorter length, and the conductive probe used to abut against the DUT can be replaced for effectively reducing the cost of the probe card device.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A transmission structure, comprising:
a supporting layer having an inner surface and an outer surface that is opposite to the inner surface;

a plurality of metal conductors each being integrally formed as an elongated structure, wherein the metal conductors are spaced apart from each other and are slantingly inserted into the supporting layer along a predetermined direction, and wherein each of the metal conductors includes:
- a positioning segment held in the supporting layer;
- a connecting segment extending from one end of the positioning segment and configured to be connected to a space transformer;
- an embedded segment extending from another end of the positioning segment; and
- an exposed segment extending from the embedded segment in a direction away from the positioning segment and configured to separably abut against a device under test (DUT), wherein a length of the embedded segment is greater than a length of the exposed segment; and an insulating resilient layer formed on the inner surface of the supporting layer so as to embed and fix the embedded segment of each of the metal conductors therein, wherein the exposed segment of each of the metal conductors protrudes from the insulating resilient layer;

wherein, when the exposed segment of any one of the metal conductors is pressed by an external force along a testing direction that is not parallel to the predetermined direction, the insulating resilient layer is configured to absorb the external force through the embedded segment of the any one of the metal conductors so as to have a deformation that provides a stroke distance;

wherein the supporting layer includes a connection circuit arranged on the inner surface, and at least two of the metal conductors are each defined as a target conductor, and wherein each of the at least two target conductors has a protruding portion extending from the embedded segment thereof and embedded in the insulating resilient layer, and the protruding portions of the at least two target conductors abut against the connection circuit so as to be electrically coupled to each other.

2. The transmission structure according to claim 1, wherein the supporting layer includes two guiding boards stacked upon each other, and the two guiding boards are in a staggered arrangement so as to enable the positioning segment of each of the metal conductors to be held and arranged in the predetermined direction.

3. The transmission structure according to claim 1, wherein the positioning segment of any one of the metal conductors and the outer surface of the supporting layer have a slanting angle therebetween that is within a range from 56 degrees to 88 degrees.

4. The transmission structure according to claim 1, wherein the at least two target conductors are at least two grounding conductors, respectively, or are at least one pair of differential signal conductors.

5. The transmission structure according to claim 1, wherein the connection circuit includes two transmission lines that are formed on the inner surface and a capacitor that connects the two transmission lines, and wherein the at least two target conductors include a power conductor and a grounding conductor, and the protruding portion of the power conductor and the protruding portion of the grounding conductor abut against the two transmission lines, respectively.

* * * * *